(12) United States Patent
Hirschman et al.

(10) Patent No.: US 11,158,504 B2
(45) Date of Patent: Oct. 26, 2021

(54) FLASH-LAMP ANNEALING METHOD OF MAKING POLYCRYSTALLINE SILICON

(71) Applicant: Corning Incorporated, Corning, NY (US)

(72) Inventors: Karl D Hirschman, Henrietta, NY (US); Robert George Manley, Vestal, NY (US); Tarun Mudgal, Boise, ID (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/635,056

(22) PCT Filed: Jul. 30, 2018

(86) PCT No.: PCT/US2018/044383
§ 371 (c)(1),
(2) Date: Jan. 29, 2020

(87) PCT Pub. No.: WO2019/027902
PCT Pub. Date: Feb. 7, 2019

(65) Prior Publication Data
US 2020/0251335 A1    Aug. 6, 2020

Related U.S. Application Data

(60) Provisional application No. 62/539,042, filed on Jul. 31, 2017.

(51) Int. Cl.
*H01L 21/02*    (2006.01)

(52) U.S. Cl.
CPC .. *H01L 21/02667* (2013.01); *H01L 21/02422* (2013.01); *H01L 21/02532* (2013.01); *H01L 21/02595* (2013.01)

(58) Field of Classification Search
None
See application file for complete search history.

(56) References Cited

U.S. PATENT DOCUMENTS

| 5,843,225 A | 12/1998 | Toru et al. |
| 7,183,229 B2 | 2/2007 | Yamanaka |

(Continued)

FOREIGN PATENT DOCUMENTS

| CN | 1255742 A | 6/2000 |
| CN | 1316769 A | 10/2001 |

(Continued)

OTHER PUBLICATIONS

Arora et al. "Electron and Hole Mobilities in Silicon as a Function of Concentration and Temperature," 1982, IEEE, vol. ED-29, No. 2, pp. 292-295. (Year: 1982).*

(Continued)

*Primary Examiner* — Bo B Jang

(57) ABSTRACT

A method of making polycrystalline silicon (p-Si), including: depositing amorphous silicon to produce an amorphous silicon super-mesa; dehydrogenating the amorphous silicon; patterning the super-mesa to produce a patterned substrate; depositing a capping oxide layer on the amorphous silicon on the patterned substrate; heating the capped, patterned substrate to the crystallization temperature of the a-Si; and flash lamp annealing the patterned substrate with a xenon lamp to produce p-Si having at least one super-mesa, and the super-mesa having supersized grains. Also disclosed are p-Si articles and devices incorporating the articles, and an apparatus for making the p-Si articles.

11 Claims, 11 Drawing Sheets

(56) References Cited

U.S. PATENT DOCUMENTS

| | | | |
|---|---|---|---|
| 8,455,337 | B2 | 6/2013 | Jin et al. |
| 8,987,123 | B2 | 3/2015 | Yamada et al. |
| 2004/0224446 | A1* | 11/2004 | Yeh .................. H01L 29/78675 438/166 |
| 2006/0130939 | A1 | 6/2006 | Jang et al. |
| 2007/0087492 | A1 | 4/2007 | Yamanaka |
| 2009/0175605 | A1 | 7/2009 | Kobayashi |
| 2011/0223698 | A1 | 9/2011 | Jin et al. |
| 2013/0017630 | A1 | 1/2013 | Seong-Hyun et al. |
| 2013/0026479 | A1 | 1/2013 | Kawashima et al. |
| 2013/0078744 | A1 | 3/2013 | Kiyama et al. |
| 2013/0078786 | A1 | 3/2013 | Fuse et al. |

FOREIGN PATENT DOCUMENTS

| | | |
|---|---|---|
| CN | 1123934 C | 10/2003 |
| CN | 1201380 C | 5/2005 |
| JP | 2002057301 A | 2/2002 |
| JP | 2013-084902 A | 5/2013 |
| KR | 10-0882234 B1 | 2/2009 |
| KR | 10-2011-0102687 A | 9/2011 |
| KR | 10-1097348 B1 | 12/2011 |
| KR | 10-2013-0033296 A | 4/2013 |
| KR | 10-2013-0033299 A | 4/2013 |
| KR | 10-1380436 B1 | 4/2014 |
| KR | 10-1414849 B1 | 7/2014 |

OTHER PUBLICATIONS

Hong et al; "Microsecond Crystallization of Amorphous Silicon Films on Glass Substrates by Joule Heating"; ECS Transactions, 75 (10), 27-35 (2016.

International Search Report and Written Opinion of the International Searching Authority; PCT/US2018/044383; dated Nov. 7, 2018; 13 Pages; European Patent Office.

Manley et al; "Development of Integrated Electronis on Silicon-on-Glass (SiOG) Substrate"; ECS Transactions, 16 (9), 371-380 (2008).

Mudgal et al; "CMOS Thin-Film Transistors via Xe Flash-Lamp Crystallization of Patterned Amorpohous Si"; ECS Journal of Solid State Science and Technology, 6 (12) pp. Q179-Q181 (2017).

Mudgal et al; "Crystallization of Amorphous Silicon and Dopant Activation Using Xenon Flash-Lamp Annealing (FLA)"; Mater. Res. Soc. Symp. Proc. vol. 1666; 2014; 6 Pages.

Ohdaira et al; "Explosive Crystallization of Amorphous Silicon Films by Flash Lamp Annealing" ; Journal of Applied Physics; 106; 044907-044907-8 (2009).

Ohdaira et al; "Large-Grain Polycrystalline Silicon Films Formed Through Flash-Lamp-Induced Explosive Crystallization"; Japanese Journal of Applied Physics, 51 (2012) 10NB15-1-10NB15-4.

Ohdaira et al; "Liquid-Phase Explosive Crystallization of Electron-Beam-Evaporated A-Si Films Induced by Flash Lamp Annealing"; Journal of Crystal Growth; 362; pp. 149-152 (2013.

Pecz et al; "Crystallization of Amorphous-Si Films by Flash Lamp Annealing"; Applied Surface Science, 242, (2005) 185-191.

Saxena et al; "Polycrystalline Silicon Thin-Film Transistor Using Xe Flash-Lamp Annealing" IEEE Electron Devie Letters, vol. 31., No. 11, Nov. 2010; pp. 1242-1244.

Saxena et al; "Protrusions of Super Grains Formed by Ultrashort Xe Flash-Lamp Annealing of Amorphous Silicon and Its Effect on the Performances of Thin-Film Transistors"; IEEE Transactions on Electron Devices, vol. 58, No. 8, Aug. 2011; pp. 2638-2643.

Watanabe et al; "The Formation of Poly-Si Films on Flat Glass Substrates by Flash Lamp Annealing"; Thin Solid Films, 595 (2015) 235-238.

Yan et al; "Pulsed-Light Crystallization of Thin Film Silicon, Germanium, and Silicon Germanium Alloy"; Mater. Res. Soc. Symp. Proc. vol. 1666, 6 Pages; 2014.

\* cited by examiner

FLASH-LAMP ANNEALING METHOD OF MAKING POLYCRYSTALLINE SILICON

CROSS-REFERENCE TO RELATED APPLICATIONS

This application claims the benefit of priority under 37 U.S.C. § 371 to International Patent Application No. PCT/US2018/044383, filed Jul. 30, 2018, which claims the benefit of priority under 35 U.S.C. § 119 to U.S. Provisional Patent Application No. 62/539,042, filed Jul. 31, 2017, the contents of all of which are relied upon and incorporated herein by reference in their entirety.

This application claims the benefit of priority under 35 U.S.C. § 119 of U.S. Provisional Application Ser. No. 62/539,042, filed on Jul. 31, 2017, the content of which is relied upon and incorporated herein by reference in its entirety.

The entire disclosure of each publication or patent document mentioned herein is incorporated by reference.

BACKGROUND

The disclosure relates to a method of making polycrystalline silicon and to silicon products of the method.

SUMMARY

In embodiments, the disclosure provides a method of making polycrystalline silicon, and an apparatus for making the polycrystalline silicon.

In embodiments, the disclosure provides polycrystalline silicon products and devices containing polycrystalline silicon made from the method and the disclosed polycrystalline silicon (p-Si).

In embodiments, the disclosure provides a method for flash-lamp annealing, which method provides edge-directed crystallization of amorphous silicon (a-Si) to polycrystalline silicon.

In embodiments, the disclosure provides polycrystalline silicon and articles thereof having long (e.g., greater than 1 micron) channel devices having aligned grains and having minimal grain boundaries. The minimal grain boundaries avoid mobility degradation.

BRIEF DESCRIPTION OF THE DRAWINGS

In embodiments of the disclosure.

DETAILED DESCRIPTION

Figure 1:
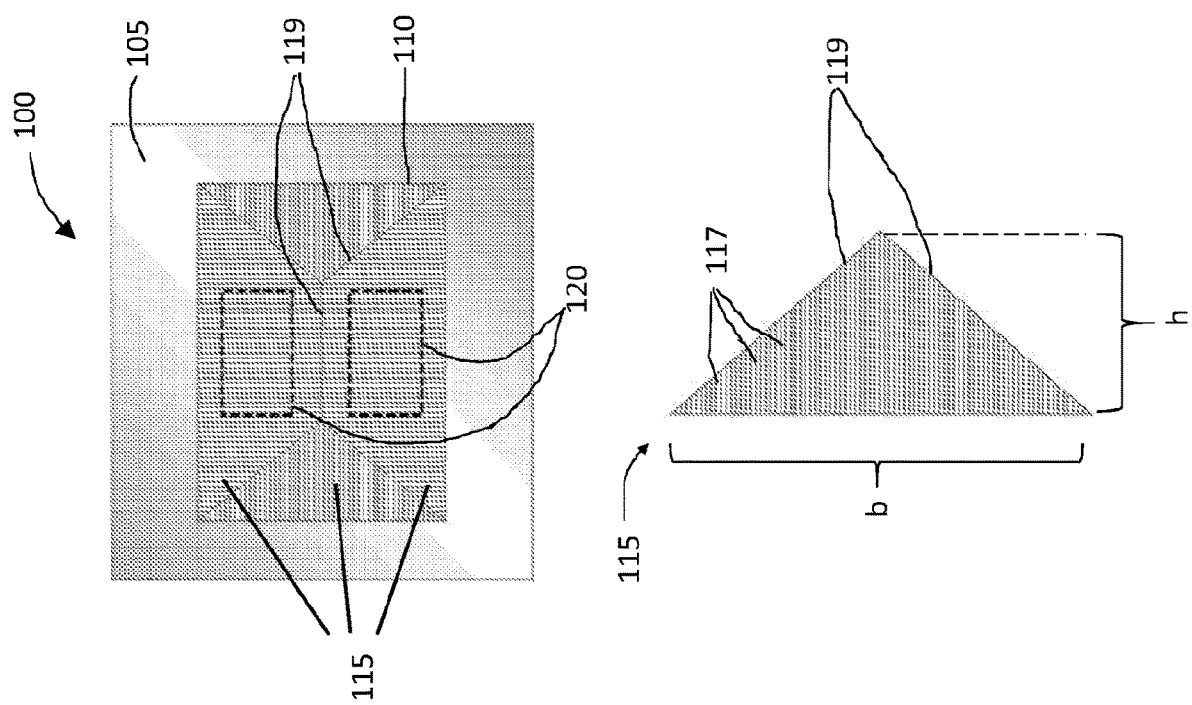
FIG. 1 shows a schematic of a disclosed super mesa (100) as defined herein.

Various embodiments of the disclosure will be described in detail with reference to drawings, if any. Reference to various embodiments does not limit the scope of the invention, which is limited only by the scope of the claims attached hereto. Additionally, any examples set forth in this specification are not limiting and merely set forth some of the many possible embodiments of the claimed invention.

In embodiments, the disclosed method of making, apparatus, and resulting products provide one or more advantageous features or aspects, including for example as discussed below. Features or aspects recited in any of the claims are generally applicable to all facets of the invention. Any recited single or multiple feature or aspect in any one claim can be combined or permuted with any other recited feature or aspect in any other claim or claims.

Definitions

"Strain point" refers to a point where stresses within a material relax within several hours. Stresses acquired at temperatures above the strain point, and not relaxed by annealing, remain in the glass indefinitely and may cause failure. Soda lime glass has a low strain point of 514° C. A moderate strain point would be 665° C. such as Corning, Inc., EXG®. A high strain point glass of 752° C. is, for example, Corning, Inc., Lotus NXT®.

"Super-mesa" refers to an isolated silicon island on a substrate that will eventually be subdivided into transistor active regions. The super mesa is flash lamp crystallized before the active regions are formed. The resulting active regions may be divided into as little as one active region to a plurality (e.g., 10 to several hundred) of active regions depending upon, for example, transistor dimensions (width and length), transistor design rules, and the initial super mesa size. For a super-mesa having the same dimensions, i.e., x=y, and divided into super grains of equal size (e.g., triangles) the maximum, single active region area is given by the formula: bh/4, where b is the base of the super grain and h is the height of the super grain in the x, y plane (see FIG. 1).

"Supersized grain", "super grain", or like terms refer to a domain comprised of two or more crystallites. The domains of a super grain are formed when two or more crystallization fronts meet and form a boundary. Ideally the crystallites are aligned based on their longest growth vector, for example, the crystallites have an aspect ratio, i.e., a length (l) greater than the width (w) (i.e., l:w>1). The individual crystallites within the super grain may or may not have the same crystal orientation.

"Polycrystalline silicon," "polysilicon," "poly-Si," "p-Si," and like terms refer to a high purity, polycrystalline form of silicon.

FLAPS refers to polycrystalline silicon formed by flash-lamp annealing (FLA).

"Mobility," and like terms refer to the field effect channel mobility of electrons.

"Include," "includes," or like terms means encompassing but not limited to, that is, inclusive and not exclusive.

"About" modifying, for example, the quantity of an ingredient in a composition, concentrations, volumes, process temperature, process time, yields, flow rates, pressures, viscosities, and like values, and ranges thereof, or a dimension of a component, and like values, and ranges thereof, employed in describing the embodiments of the disclosure, refers to variation in the numerical quantity that can occur, for example: through typical measuring and handling procedures used for preparing materials, compositions, composites, concentrates, component parts, articles of manufacture, or use formulations; through inadvertent error in these procedures; through differences in the manufacture, source, or purity of starting materials or ingredients used to carry out the methods; and like considerations. The term "about" also encompasses amounts that differ due to aging of a composition or formulation with a particular initial concentration or mixture, and amounts that differ due to mixing or processing a composition or formulation with a particular initial concentration or mixture.

"Optional" or "optionally" means that the subsequently described event or circumstance can or cannot occur, and that the description includes instances where the event or circumstance occurs and instances where it does not.

The indefinite article "a" or "an" and its corresponding definite article "the" as used herein means at least one, or one or more, unless specified otherwise.

Abbreviations, which are well known to one of ordinary skill in the art, may be used (e.g., "h" or "hrs" for hour or hours, "g" or "gm" for gram(s), "mL" for milliliters, and "rt" for room temperature, "nm" for nanometers, and like abbreviations).

Specific and preferred values disclosed for components, ingredients, additives, dimensions, conditions, times, and like aspects, and ranges thereof; are for illustration only; they do not exclude other defined values or other values within defined ranges. The composition and methods of the disclosure can include any value or any combination of the values, specific values, more specific values, and preferred values described herein, including explicit or implicit intermediate values and ranges.

In embodiments, the disclosure provides equipment, process parameters, and thin-film transistors (TFT) design rules for making high performance TFT on glass substrates (i.e., having lower thermal conductivity, and high optical transparency).

In embodiments, particular aspects of the disclosure can include, for example:

an edge directed crystallization method from preparing thin films such as silicon, germanium, diamond, and like materials;

a heated vacuum purge chamber compatible with the disclosed flash lamp annealing method;

process settings for a flash lamp and a-silicon to achieve aligned super-grain (e.g., domains greater than 10 microns) growth of silicon on a glass substrate; and design rules for integrating transistors with aligned grains.

The following process conditions are significant and exemplary to achieve the disclosed aligned super-grain FLAPS material:

about 60 nm amorphous silicon deposited via PECVD on 250 nm $SiO_2$ on display glass;

a dehydrogenation furnace anneal at 450° C. for 2 hrs;

super-mesa pattern definition;

plasma etch removal of the a-silicon regions between super-mesas;

photoresist removal, and clean wafers with piranha solution;

deposit 100 nm $SiO_2$ capping layer using PECVD TEOS; and expose the $SiO_2$-capped patterned amorphous silicon mesa samples using a xenon flash lamp at an intensity of about 20 $kW/cm^2$ and of from 100 to 400 microseconds such as 250 microseconds.

Figure 3:
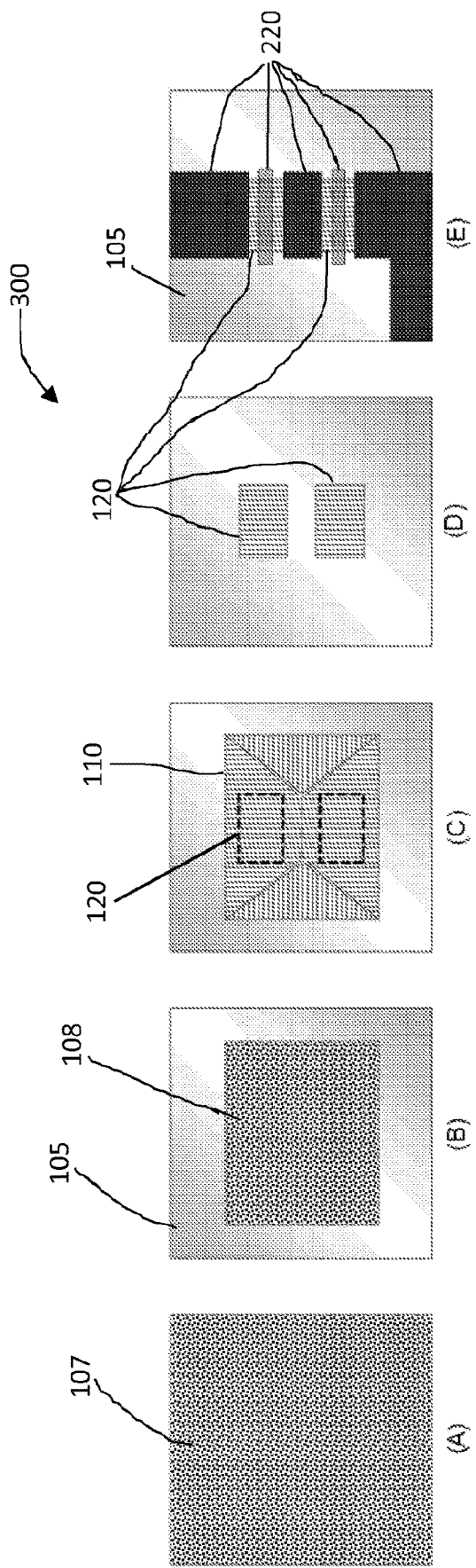
FIG. 3 is a plan view (300) that shows the disclosed method shown in FIG. 2 of forming high quality, aligned-grain, active regions for flash-lamp annealed polycrystalline silicon thin-film transistors (FLAPS TFTs).

The following are selected design rules for self-aligned gate and non-self-aligned gate FLAPS TFTs:

super-mesa pattern definition preferably exceeds the desired mesa pattern by, for example, 10 microns on border regions (i.e., the mesa pattern is inside of the super-mesa border by a minimum of 10 microns, and within a trapezoid resulting from the merger of crystallization fronts as represented in FIG. 3 (C));

mesa pattern definition preferably is oriented such that adjacent grains form boundaries aligned to the direction of the channel length (e.g., the channel width is defined by the mesa pattern definition);

the gate pattern definition overlaps the mesa borders in the direction of the channel width to avoid source/drain implant encroachment into the edges of the channel region (e.g., in a self-aligned gate structure) and ensures complete electrostatic control over carriers in the channel (i.e., the channel length in self-aligned gate TFTs is defined by the gate pattern definition);

the source/drain pattern definition overlaps the mesa edges (e.g., for non-self-aligned gate TFTs the source/drain pattern definition defines the channel length and overlaps the gate pattern definition); and traditional design rules for contact and metallization pattern definitions apply.

Prior publications of interest include, for example:

B. Pecz, et al., Applied Surface Science 242 (2005), 185 to 191.

T. Mudgal, et al., "Crystallization of Amorphous Silicon and Dopant Activation using Xenon Flash-Lamp Annealing (FLA), Mater. Res. Soc. Symp. Proc. Vol. 1666, 2014, Materials Research Society, DOI: 10.1557/opl.2014.722. This reference was an early investigation on crystallization and dopant activation using FLA, however no devices (e.g., TFTs) were made. All work was done on blanket films, so crystal nucleation was random rather than edge directed. There was a 100 nm capping $SiO_2$ layer on the 60 nm amorphous silicon, but there was no patterning and etching. Raman spectroscopy verified crystallization with comparisons made between treatments, however the resulting grain size and orientation were not characterized.

T. Watanabe, et al., The formation of poly-Si films on flat glass substrates by flash lamp annealing, Thin Solid Films 595 (2015) 235-238.

S. Saxena, et al., Polycrystalline Silicon Thin-Film Transistor Using Xe Flash-Lamp Annealing, IEEE Electron Device Letters, 31, 1242 (2010).

S. Saxena, et al., Protrusions of Super Grains Formed by Ultrashort Xe Flash-Lamp Annealing of Amorphous Silicon, and Its Effect on the Performances of Thin-Film Transistors, IEEE TRANSACTIONS ON ELECTRON DEVICES, VOL. 58, NO. 8, August 2011.

R. G. Manley, et al., Development of Integrated Electronics on Silicon-on-Glass (SiOG) Substrate, ECS Transactions, 16 (9) 371-380 (2008).

In embodiments, the present disclosure provides a method of making polycrystalline silicon comprising:

depositing amorphous silicon ("a-Si") on at least a portion of a suitable substrate such as glass, the substrate having a strain point of from 650° C. to 800° C., for example, Lotus® XT available from Corning, Inc., to produce at least one amorphous silicon super-mesa on the substrate;

dehydrogenating the at least one amorphous silicon super-mesa on the substrate (e.g., by annealing at 450☐ to yield a-Si super-mesa having a hydrogen concentration of less than about 10 mol %);

patterning the super-mesa on the substrate to produce a patterned substrate (i.e., defining a geometry to force, direct, or select grain growth, e.g., using conventional photoresist patterning technology and pre-activation etching methods);

depositing a capping oxide layer on the amorphous silicon (e.g., comprised of a $SiO_2$ film having a thickness of from 50 to 150 nm) to form a capped, patterned substrate;

heating the capped, patterned substrate (e.g., from 525 to 550° C.) below the intrinsic solid phase crystallization temperature of amorphous silicon; and flash lamp annealing (FLA) the resulting heated, capped, and patterned substrate with a xenon lamp at a voltage of from 550 to 700 V and a suitable pulse duration while continuing to heat at of from 525 to 550° C., to produce polycrystalline silicon having at least one super-mesa, and the super-mesa having supersized grains (i.e., the supersized grains having at least one long dimension of from 50 to 250 microns; whereas less than 30 microns is a nanocrystal, and greater than 500 microns can lead to random nucleation).

In embodiments, the suitable pulse duration can be, for example, from 150 to 300 microseconds, from 150 to 300 microseconds, from 200 to 275 microseconds, and from 200 to 250 microseconds, including intermediate values and ranges. In embodiments, an especially preferred pulse duration is 250 microseconds.

In embodiments, the method can further comprise removing the mesa from the supersized grains, e.g., having aligned grains that are free of metal contamination.

In embodiments, removing the mesa can be accomplished by any suitable method of, for example, cutting, etching, ablation, or a combination thereof, and size of the removed mesa are any size suitable for a transistor article.

In embodiments, the method can further comprise forming a transistor having a grain direction parallel to the direction of current flow, e.g., from a source to a drain in a MOSFET device.

In embodiments, the crystal growth of the polycrystalline silicon is edge initiated.

In embodiments, patterning the super-mesa comprises, for example, a masking and etching including photolithography combined with aqueous or plasma etching.

In embodiments, the substrate can be selected from, for example, a glass sheet, a roll-to-roll glass, a sheet-to-sheet glass, a glass-ceramic sheet, and combinations thereof.

In embodiments, the present disclosure provides a conducting device comprising:

at least two silicon grains on a glass substrate; and the device having an electron mobility of greater than 300 $cm^2$ per volt second, a hole mobility of from 100 $cm^2$ per volt second, and a sub-threshold swing, i.e., a measure of on-off slope; the reciprocal of sub-threshold slope, of less than 150 mV/decade at 25° C.

Prior art devices that have polycrystalline silicon made using, for example, metal induced crystallization methods can have mobilities of from 0 to 200 $cm^2$ per volt second, and using, for example, eximer laser annealing (ELA) induced methods can have mobilities of from 120 to 150 $cm^2$ per volt second. A device of the disclosure can have a steep sub-threshold slope and can exhibit a faster transition between off (low current) and on (high current) states.

In embodiments, the electron mobility can be, for example, of from 350 to 450 $cm^2$ per volt second and sub-threshold swing can be, for example, of from 60 to 100 mV/decade at 25° C. A device having a steep sub-threshold slope exhibits a faster transition between off (low current) and on (high current) states.

In embodiments, the device can be included in or selected from at least one of, e.g., any thin film semiconductor: a MOSFET (including various gate configurations, e.g., top gate, poly gate, co-planar, staggered, bottom gate co-planar staggered; multigate, etc.), a diode, a capacitor, and combinations thereof.

In embodiments, the disclosure provides a method of making a device comprising: incorporating at least one device made in accordance with the present disclosure into another device or platform.

The presently disclosed method of silicon crystallization and products thereof are advantaged in several aspects, particularly over eximer laser annealing (ELA) processed low-temperature polycrystalline silicon (LTPS), including for example:

formation of polycrystalline Si films having large grains (e.g., length greater than 1 micron);

the formation of films having high electron mobilities such as 1 $cm^2$/Vs, approaching that of Corning, Incorporated's SiOG technology of 500 $cm^2$/Vs but having simpler 1 $cm^2$/Vs processing;

the formation of polycrystalline films having aligned grains;

edge directed crystallization for predictable growth behavior and transistor channel alignment;

short crystallization times, for example, 200 to 300 microseconds;

superior device performance attainable using high-strain point, low compacting glass substrates due to the ability to perform furnace annealing at higher temperatures (e.g. 630° C.);

minimal dopant segregation at grain boundaries, which leads to lower sheet resistance such as less than 500 Ω/sqr;

simpler processing and ease of scale-up compared to eximer laser annealing (ELA);

greater throughput compared to ELA;

roll-to-roll compatibility of the polycrystalline-substrate products;

the method of making polycrystalline silicon enables pre-deposition or solid source doping (i.e., it may be possible to eliminate ion implantation);

the method of making provides a larger range of film thickness compatibility (e.g., thicker films);

the method of making can be used for making photovoltaic devices (PV) including, for example, devices having vertical junction integration;

the method of making is self-aligned gate-source/drain compatible;

the method of making is bottom gate compatible;

the disclosed polycrystalline silicon crystallization method can be accomplished in ambient atmosphere;

the disclosed polycrystalline silicon crystallization method uses no toxic gas and does not generate toxic gas or fumes;

the disclosed apparatus can be combined the with a CVD chamber (i.e., for in situ crystallization of a-Si films); and the disclosed method is scalable to commercial production to, for example, substrates greater than about 1870 mm×2200 mm (e.g. GEN 7).

In embodiments, the disclosure provides an improved apparatus, material processing, and semiconductor device fabrication for an advanced low temperature polycrystalline silicon (LTPS), having crystallization temperatures typically less than 800° C., enabling high performance thin-film transistors on glass substrates.

In flat panel display (FPD) and larger area electronics (LAE), technology is advancing such that faster operating devices, better uniformity and higher integration are demanding much more stringent requirements to participate in the Internet of Things (IoT) era. For years these technologies relied on amorphous silicon (a-Si) as the semiconductor of choice for the manufacture of displays and simple electronics. While a-Si is simple, uniform and cost effective to integrate, the properties of the film are such that only slow, low current drive and relatively large devices can be realized. This limitation is mainly due to the low electron mobility of the a-Si, approaching 1 $cm^2$/Vs in the very best circumstances. The a-Si material system also cannot support complementary metal oxide insulator semiconductor (CMOS) integration due to the extremely low hole mobility.

In recent years LTPS and metal-oxide semiconductors, such as indium gallium zinc oxide (IGZO), have become attractive material systems for advanced displays and electronics. Metal-oxide based semiconductors have advantages over a-Si, for example, having higher mobilities approaching 15 to 20 $cm^2$/Vs. Metal-oxide semiconductor, as stated in prior art, can be either amorphous or polycrystalline in nature, and can have high uniformity on large substrates. Most practical metal-oxide semiconductors are unipolar in nature and only support electrons as free carriers. While this leads to lower off-state leakage current levels, metal-oxide semiconductors cannot support CMOS integration. While some p-type metal-oxide semiconductors have been identified, their properties tend to be poor for electronic integration. Even if they did have desirable properties, CMOS integration would require the incorporation of two semiconductor material systems.

The LTPS materials system has been known and understood for some time, but has suffered due to high manufacturing cost and issues with maintaining material uniformity on larger area substrates. However, LTPS is a bipolar semiconductor with the potential for high electron and high hole mobilities allowing for homogeneous CMOS integration. Many methods exist for forming LTPS. It can be deposited directly from chemical vapor deposition (CVD) processes or formed through processing of a-Si thin films Excimer laser annealing (ELA) is a well-established technique for producing device quality LTPS. In this process the a-Si is irradiated with a 308 nm laser. The film goes through a partial melt, typically one third of the silicon film thickness, and re-solidifies in polycrystalline form resulting in a distribution of silicon grain sizes. The grain size distribution, alignment of the grains, and crystal orientation of the grains can all impact the final transistor performance. However, the ELA process results in random distribution of all these properties and ultimately limits the manufacturability of high performance TFTs and other devices.

In embodiments, the disclosure provides a method for making LTPS TFTs on a glass substrate using an alternative approach to the ELA method.

In embodiments, the disclosure provides a flash-lamp annealing (FLA) method for making LTPS TFTs, which method uses a series of short but intense bursts of a broad spectrum light source such as from one or more xenon flash lamps.

In embodiment, the disclosed method preferably uses only a single burst of the broad spectrum light source. The disclosed FLA method was shown to be capable of crystallizing amorphous silicon and to activate implanted dopants. The process is readily extendable to accommodate arbitrarily large substrates, such as those in flat panel manufacturing.

While FLA has been shown to crystallize thin a-Si films on glass (see for example, K. Ohdaira, et al., *J. Appl. Phys.,* 106, 044907 (2009), and K. Ohdaira, et al., *Journal of Crystal Growth,* 362, 149 (2013), which both mention crystallization of thick silicon on metal films but do not mention resulting electrical properties; Baojie Y., et al., Pulsed-light Crystallization of Thin Film Silicon, Germanium, and Silicon Germanium Alloy. MRS Proceedings, 1666, (2014), mrss14-1666-a17-02 doi:10.1557/opl.1.2014.668, which mentions thinner films, but only discuss Raman and surface roughness properties; T. Mudgal, et al., "Crystallization of Amorphous Silicon and Dopant Activation using Xenon Flash-Lamp Annealing (FLA)," MRS Proceedings, 1666 (2014)/DOI: 10.1557/opl.1.2014.722, which mentions FLA on display glass, prework on FLAPS technology using apparatus settings that were not optimized and does not mention transistor data), the reports on fabricated TFTs have been very limited (see S. Saxena, et al., IEEE Electron Device Letters, 31, 1242 (2010); which mentions P-channel device only and does not have aligned grains; and K. Ohdaira, et al., "Large-Grain Polycrystalline Silicon Films Formed through Flash-Lamp-Induced Explosive Crystallization," *Jap. J. Appl, Phys.* 51, 10NB15 (2012), which does not mention edge directed grain growth or electric properties).

In embodiments, the disclosure provides a method for making polysilicon and thin film transistors incorporating the polysilicon. The crystallization method can be accomplished in a modified commercially available FLA system having, for example, a high temperature substrate chuck for steady-state heating (e.g., a hot plate), and a high temperature ambient control chamber.

In embodiments, the disclosure provides process parameter design and provides new TFT design rules (mentioned below), which permit high performing TFTs to be made. Performance of these transistors is similar to those made in Corning's SiOG technology (see R. G. Manley, et al., supra.).

In embodiments, the disclosure provides a device comprising: at least one conducting device comprising:

at least two silicon grains on a glass substrate; and the conducting device having an electron mobility of greater than 300 $cm^2$ per volt second, a hole mobility of from 100 $cm^2$ per volt second, and a sub-threshold swing of less than 150 mV/decade at 25° C.

Other distinguishing process features of the disclosure include:

One of more xenon flash lamps can be used and the lamps typically have a broader spectral range than a laser (e.g., UV to IR) having a spectral range, for example, of from 250 to 1000 nm, of from 300 to 800 nm, including intermediate values and ranges, and a peak at about 500 nm.

Flash lamp crystallization may or may not go above the melting point of silicon. In contrast ELA does melt the silicon, typically up to one third of the layer thickness.

Multiple pulses are called for in laser methods whereas a single flash from a single source or multiple sources is suitable for FLA.

The exposure of an arbitrary area for laser methods is much less than the exposure area for FLA, which smaller laser exposure window can limit the scalability of ELA laser methods. ELA exposures can scan a high energy beam over the sample surface, where the beam width is relatively large in one direction (e.g., x-direction) and the sample moves in an orthogonal direction (e.g., y-direction). Uniformity issues and high exposure times needed for large samples makes ELA methods impractical and is cost prohibitive for panels at Gen 8 or larger.

The grains from FLA can be as small as, for example, 5 nm or larger, e.g., greater than 100 microns.

The grain growth direction in FLA can be controlled/aligned. In contrast, grain growth in normal excimer laser annealing (ELA) is random. In sequential laser solidification (SLS), larger aligned grains (e.g., about 5 microns) can be formed using a special pulse and stepping sequence of the substrate, but is not necessary for FLA.

Grains for FLA can be smaller or larger than the device feature size. For enhanced transistor device performance, it is preferred that the grains are larger than the transistor channel length and that the grains are aligned.

FLA has an advantage over metal-induced crystallization as the polysilicon remains pure and no metal contaminates remain to degrade performance of the material.

General Method for Making Crystallized Polysilicon

Initial experiments using FLA for crystallization of amorphous silicon are detailed as follows (see also: T. Mudgal, supra.).

A 60 nm a-Si:H layer was deposited on 150 mm diameter Corning EAGLE XG® display glass wafers using plasma-enhanced chemical vapor deposition (PECVD). The deposition was performed using $SiH_4$ and $H_2$ at 400° C., 1 Torr pressure and 30 W RF power. Blanket film samples were dehydrogenated at 450° C. for 1 hr in vacuum. A 100 nm $SiO_2$ capping layer/screening oxide was deposited over the a-Si film using PECVD with TEOS precursor at 380° C. These samples were then subjected to a variety of FLA treatment conditions, with substrate heating on an open-ambient hotplate providing a steady-state surface temperature of about 460° C. as measured using an infrared thermometer. The FLA system used in this work was a NovaCentrix PulseForge 3300 configured with two xenon lamps, and having a 75 mm×150 mm exposure window.

Experiments were designed to find settings that produced superior results for the crystallization of a-Si films Initial trials established the importance of substrate heating and the oxide capping layer. The PulseForge system has built-in constraints on the allowable combinations of lamp voltage, pulse duration, and pulse frequency settings, which are based on limitations of charge supply and lamp intensity. Several combinations of pulse duration and lamp intensity were explored. Pulses at high intensity (e.g., up to 50 $kW/cm^2$) are limited in duration, and did not provide enough energy for crystallization. A long pulse duration can result in high radiant exposure energy. However crystallization will not occur if the energy is not delivered in a short enough period of time. Although not bound by theory, it is believed that successful crystallization calls for maximum silicon temperature with minimal heat transfer to the substrate. Crystallization was verified using VASE® ellipsometry and Raman spectroscopy. Crystallization was found to occur at an intensity setting around I=20 $kW/cm^2$ and a pulse duration of 250 microseconds, providing a radiant exposure E of about 5 $J/cm^2$. While VASE and Raman spectroscopy, and visual observations, provided clear evidence of crystallization, performing FLA on blanket unpatterned films did not produce polysilicon grains that could be observed with an optical microscope, as was observed in previously reported work (see S. Saxena, et al., supra.). However, the previous report used a pulse duration of 100 microseconds, and was more effective at crystallization due to less thermal loss during energy delivery.

Explosive Crystallization and "Super-Grain" Formation

Figure 4:
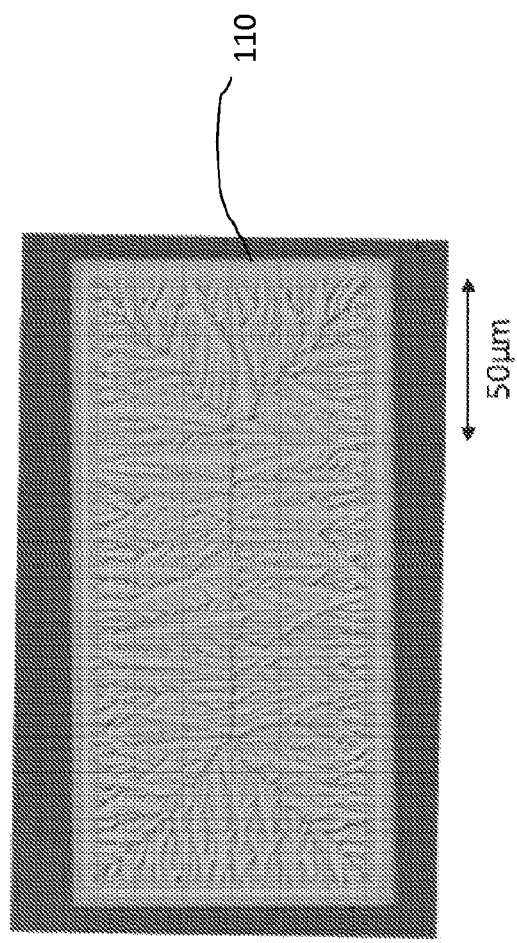
FIG. 4 shows an image of an actual and exemplary flash lamp annealed (FLA) and crystallized mesa (110) having exemplary dimensions of, for example, a width of 100 microns and a length of 200 microns.
Figure 5:
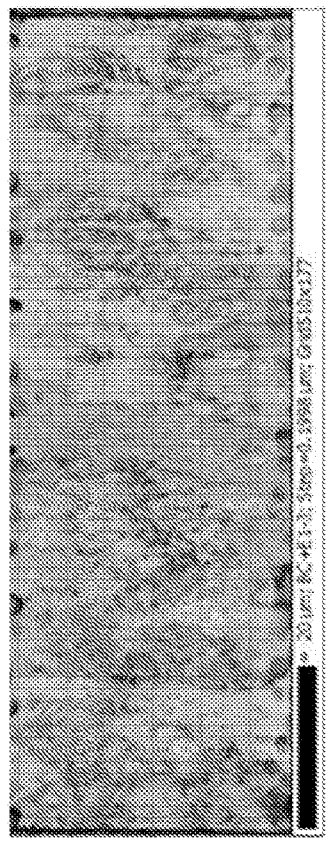
FIGS. 5A and 5B show a scanning electron microscope (SEM) image (FIG. 5A) and an Euler crystal orientation map (image in grey scale; color rendering not provided) (FIG. 5B) from Electron Backscatter Diffraction (EBSD) measurements.
Figure 5:
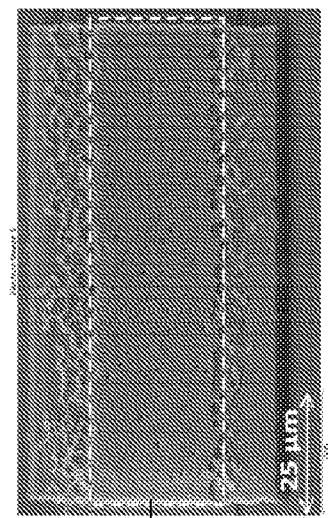

When the a-Si was patterned into mesa structures prior to deposition of the $SiO_2$ capping layer, large "super-grain" vias that can be described as explosive crystallization (see for example, K. Ohdaira, et al., "Large-Grain Polycrystalline Silicon Films Formed through Flash-Lamp-Induced Explosive Crystallization," supra.), using the established FLA exposure conditions were realized. Images also show the nucleation of these grains on the edge of patterned mesa structures, which demonstrate the ability of the disclosed methods to influence the direction of grain growth. FIG. 4 shows an FLA crystallized 100×200 micron mesa structure where nucleation originates at the edge of mesa structures and propagates inward, with a remaining nanocrystalline (i.e., sub-visible-λ) border region. The sub-grains appear to be well-aligned, propagating perpendicular to the nucleation edge, and thus edge-directed. Larger structures show nucleation originating at sites within the mesa. Mesas that are in proximity to adjacent features appear to have non-uniform crystallization, with diminished super-grain formation at adjacent edges. The work previously reported (see S. Saxena, et al., supra.), demonstrated super-grain formation on unpatterned a-Si, and there was no edge-directed behavior. Electron Backscatter Diffraction (EBSD) confirmed the relationship between the resulting surface morphology and crystal orientation. Multiple data points from each region were collected to determine crystal orientation. FIGS. 5A and 5B show an SEM image and a crystal orientation map, respectively, of the same region. While a preferred crystal orientation may not be evident, the correlation between the color map and the SEM image is readily evident.

High Temperature Ambient Control (HTAC) Chamber

A hotplate chamber was built and integrated into the apparatus, which chamber provides significant improvements in temperature and ambient control, and provides the ability to heat the substrate up to 550° C. The hotplate chamber has its own built-in quartz window, which allows for the removal of the OEM quartz window under the PulseForge lamps to minimize surface reflections. The system is microprocessor controlled with feedback and control parameters to accurately drive embedded resistive heating elements within a stainless steel sample stage. The stage can accommodate up to 150 mm round (wafer format) samples. The chamber has gas inlet and vacuum ports to evacuate atmosphere, and to provide a pressure-controlled inert ambient condition while avoiding thermal loss. The chamber is designed to fit beneath the exposure head of the PulseForge system with a clearance gap of about 2 mm. Bolometer measurements taken inside the chamber showed exposure intensity values that are within 5% of measurements taken directly under the exposure head with the OEM quartz window installed. One modification of the chamber design includes implementation of a silicon carbide susceptor for improved thermal uniformity compared to the existing stainless steel design. A further modification includes the integration of tungsten-halogen heat lamps (e.g., those implemented in rapid thermal processors) beneath the susceptor to provide steady-state heating rather than using resistive heating elements.

Demonstration of FLAPS TFTs

Figure 7:
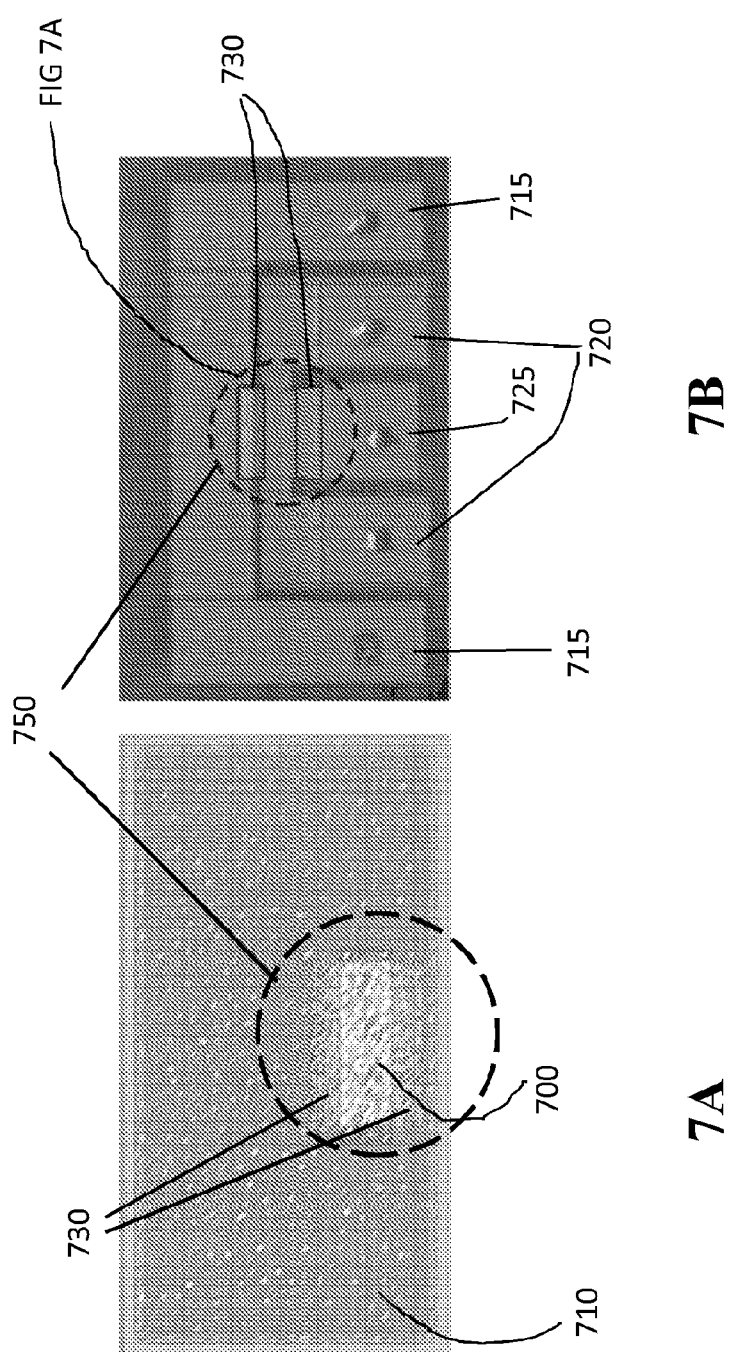
FIGS. 7A and 7B show a FLAPS device as a partially processed mesa (FIG. 7A image) showing the mesa structure (750) (the remainder of super-mesa having been etched away) with source/drain and channel regions exhibiting a different apparent texture (i.e., color appearance image not provided).

Experiments have demonstrated that high-performance LTPS TFTs can be achieved with FLAPS material. FIGS. 7A and 7B, respectively, show a FLAPS in a fabrication process for a 4-probe Van der Pauw test structure (see for example, O. Paul, IEEE Transactions on Semiconductor Manufacturing, Vol. 13, No. 2, May 2000) and a TFT. The following process flow for non-self-aligned top-gate TFTs was followed for preparing the devices in this discussion.

Figure 2:
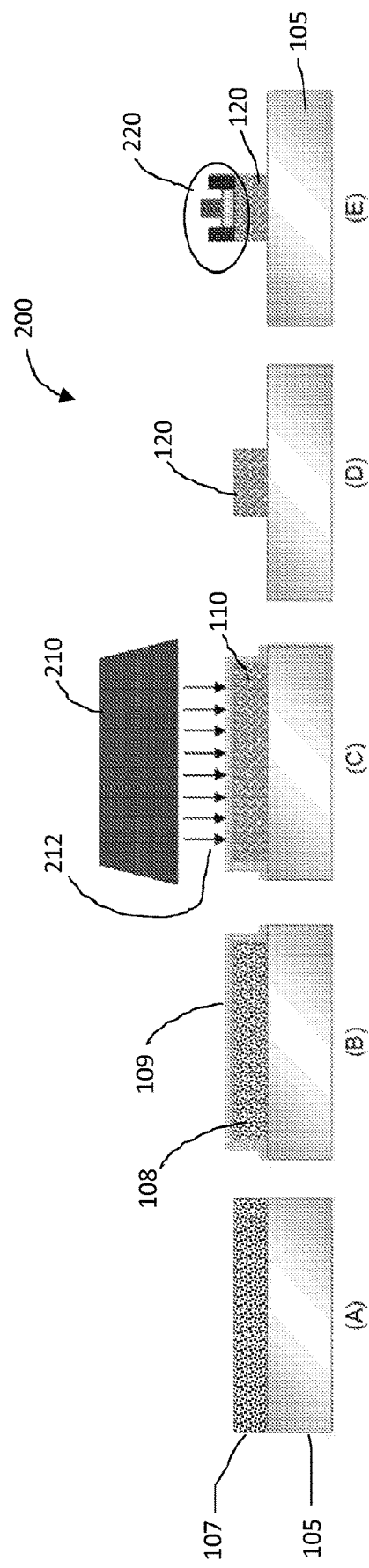
FIG. 2 shows a schematic (200) summary of the disclosed method encompassing starting material substrates that lead to high performance transistors.

A combination of super-mesa and mesa pattern definitions were used as presented in FIGS. 1, 2, and 3. The super-mesa provides sacrificial edge material that extends beyond the mesa, or active device region. The super-mesa was designed to provide a sacrificial border region of 20 microns (e.g., at a minimum), and large enough such that crystallization fronts do not merge to form a boundary in the device mesa active region (see FIGS. 3 (C) and 3 (D)). The super-mesa pattern was transferred into the a-Si material using reactive-ion etching (RIE) with $CF_4$ and $O_2$ with the following conditions: power=150 W, pressure=175 mT, and time=60 sec. The photoresist was removed and an RCA clean was done to remove any metallic or organic contaminants. A 100 nm $SiO_2$ capping layer was deposited by PECVD using TEOS as a precursor, at 380° C. with a deposition time of about 12 sec. This capping layer serves several significant functions, which can include providing a thermal buffer to the surface and acting as an anti-reflective layer for the FLA exposure. The capping layer also serves as a screen oxide layer to position the boron and phosphorus implant profiles within the a-Si layer. The source/drain regions were lithographically defined, followed by high-dose ($\phi=4\times10^{15}$ cm$^{-2}$) implants of boron and phosphorus done at energies of 35 keV and 60 keV, respectively. Following photoresist removal the samples were ready for the FLA process.

The FLA exposure served to both crystallize the a-Si and to activate the implanted dopant. The HTAC chamber maintained a temperature of 550° C. with a nitrogen purge at atmospheric pressure. The FLA exposures were done with lamp voltage supplies at 600 V and a time of 200 microseconds, with bolometer measurements showing an integrated energy of about 6 J/cm². These exposure conditions produced the FLAPS observed in FIGS. 5A and 5B.

Following FLAPS formation, the screen or capping oxide was removed in buffered hydrofluoric acid, and the mesa (active transistor region) was patterned. The RIE process described previously was used to remove the sacrificial super-mesa regions. Piranha (sulfuric acid/hydrogen peroxide mixture) and $HCl/H_2O_2$ cleaning solutions were then used to remove any contaminants prior to the PECVD gate oxide deposition, using the same process as described for the oxide. This was then followed by a 630° C., 12 hr furnace anneal in nitrogen ambient which serves several functions, i.e., additional dopant activation, grain growth, defect reduction, and stress relaxation.

Contact regions were then patterned, with the oxide etched in buffered HF. Following photoresist removal a 1 micron thick aluminum film was sputter deposited using a 2,000 W DC argon plasma. The design of the non-self-aligned transistors included a gate overlap of the source/drain implanted regions of 4 microns for overlay tolerance. The source/drain and gate electrodes were patterned and etched in Transene type-A aluminum etchant. Finally the devices were sintered in a forming gas ambient (5% $H_2$ in $N_2$) at 450° C. for 30 min.

Figure 8:
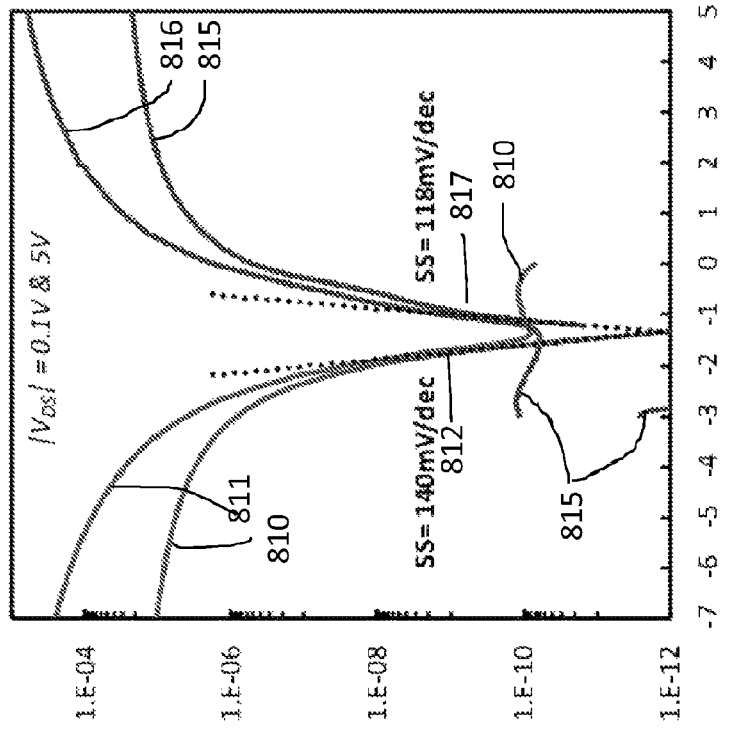
FIGS. 8A and 8B, respectively, show CMOS transfer characteristics using linear (8A)(|Vds|=0.1V) and log (8B) (|Vds|=0.1V and 5 V) scales.
Figure 8:
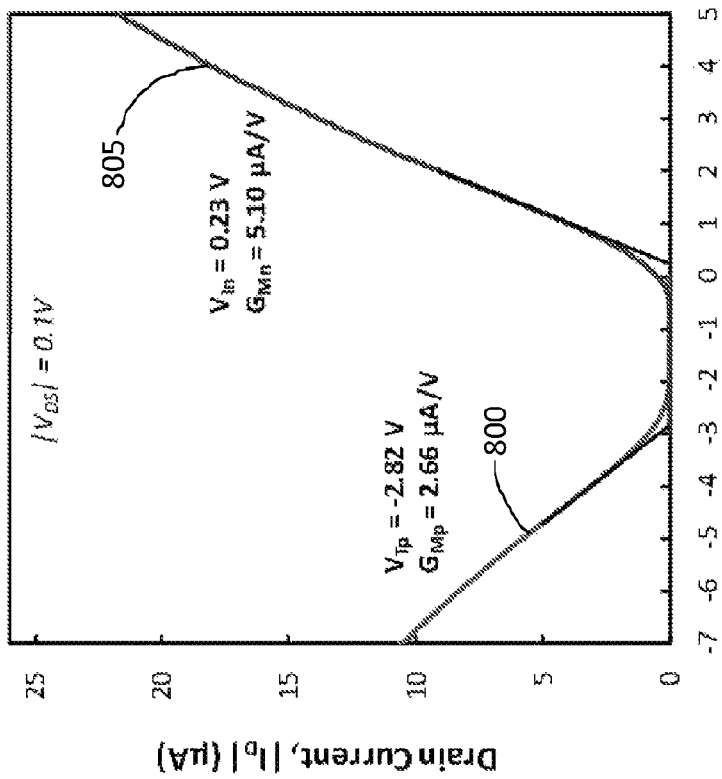

The disclosed FLA-crystallized polysilicon devices provide superior device performance and the results are shown in the graphs in FIGS. 8A and 8B. While the devices exhibit certain non-ideal behavior, the results are quite suggestive and clearly demonstrate the potential for the disclosed method, materials, and articles.

Figure 9:
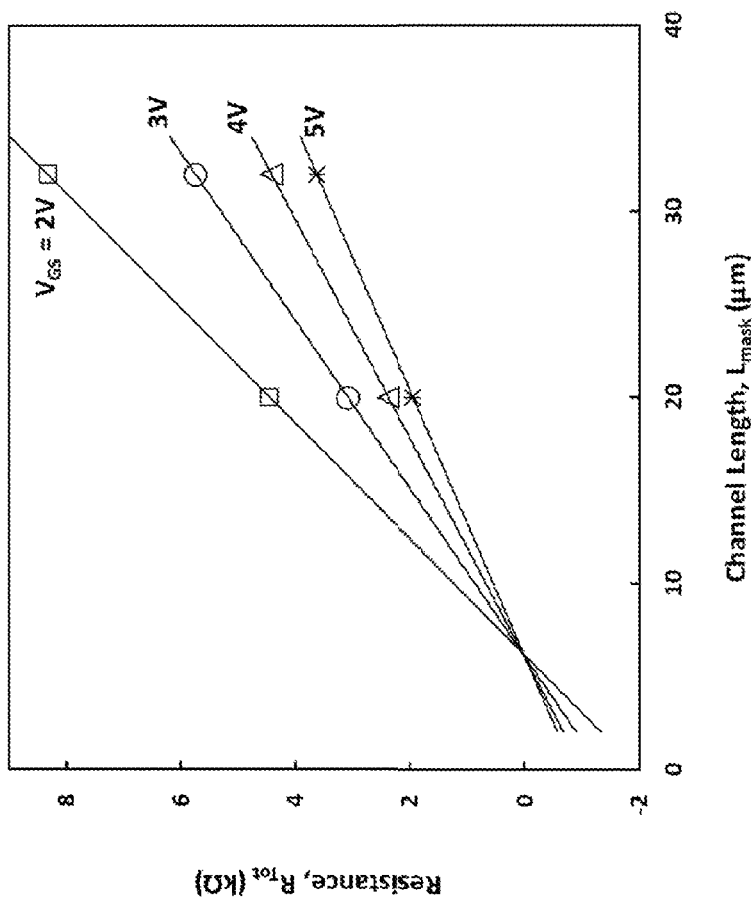
FIG. 9 shows a NFET T-M analysis of NMOS TFTs.
Figure 10:
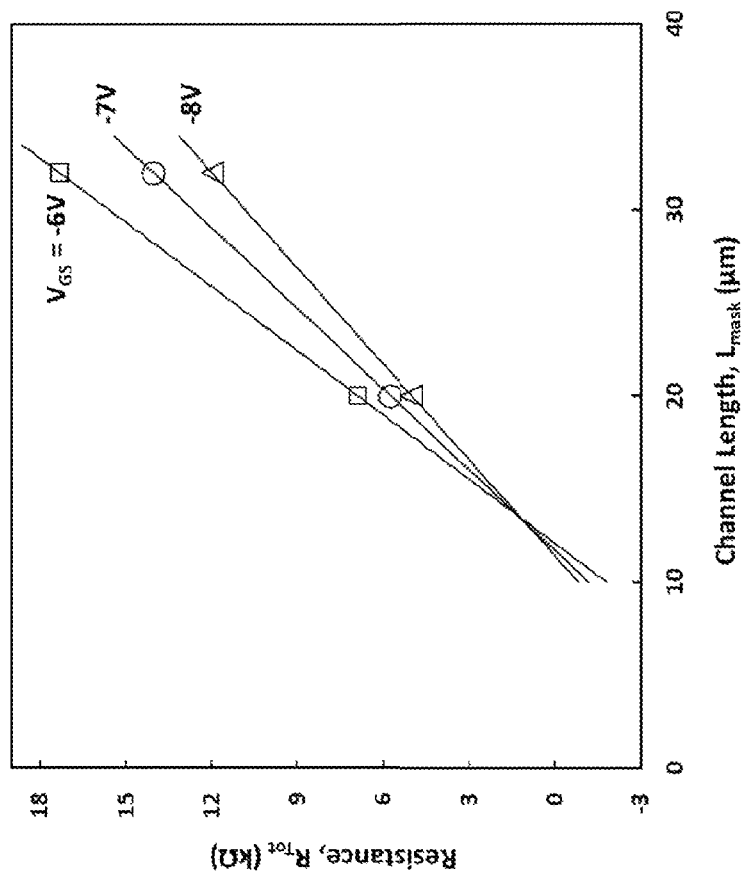
FIG. 10 shows a PFET T-M analysis of PMOS TFTs.

The following device parameters were obtained using the physical dimensions, and transfer characteristics in FIGS. 8A and 8B, and the Terada-Muta (T-M) method to establish the effective channel length. The T-M plots and results are shown in FIGS. 9 and 10. Table 1 lists the physical parameters of CMOS (i.e., PMOS & NMOS) TFTs, and electrical parameters that characterize the on-state and off-state performance.

TABLE 1

Summary of exemplary CMOS TFT operational parameters.

| | Parameter | | NMOS | PMOS |
|---|---|---|---|---|
| Physical | $L_{mask}$ | | 32 μm | 32 μm |
| | $\Delta L$ | | 6.3 μm | 13.4 μm |
| | $L_{eff}$ | | 25.7 μm | 18.6 μm |
| | W | | 100 μm | 100 μm |
| | $W/L_{eff}$ | | 3.89 | 5.38 |
| | $C_{ox}$ | | 34.5 nF/cm² | 34.5 nF/cm² |
| On-State | $V_T$ | | 0.23 V | -2.82 V |
| | $g_{m(max)}$ @ $|V_{DS}|$ = 0.1 V | | 5.10 μA/V | 2.66 μA/V |
| | $\mu_{ch(max)}$ | | 380 cm²/V · s | 143 cm²/V · s |
| Off-State | $I_{(leak)}$ @ $|V_{DS}|$ = 5 V | | ~1 pA/μm | ~1 pA/μm |
| | $SS_{(min)}$ | | 120 mV/dec | 140 mV/dec |

The analysis is based on selected results. The extracted channel mobility values are consistent with the effective channel lengths ($L_{eff}$) arrived at using the T-M analysis. The electron/hole channel mobility ratio is about 2.7, which is consistent with crystalline silicon. Further analysis found that these electrical results correspond to full melting of the super-mesa during FLA, which supports large polycrystalline silicon grains. Molten silicon with dopants present also provides an explanation for the large $\Delta L$ from the T-M analysis as a result of the diffusivity of phosphorus and boron in liquid phase silicon. Additional notable aspects include:

T-M analysis was performed on two different channel length devices that had similar electrical behavior.

While only two channel lengths were used for the T-M analysis, the convergence of extrapolated characteristics over different gate voltages supports the analysis results for $L_{eff}$.

The use of $L_{eff}$ for the mobility calculation is significantly more conservative than use of $L_{mask}$.

The ratio of channel mobility for electrons and holes is consistent with that observed in crystalline silicon devices.

There are several alternatives or variants that can be selected to improve the device performance, manufacturability, or both. These include, for example, design of the device structure, FLA system (process and parameter settings), and process integration.

Regarding the device structure such as for TFT, a self-aligned top-gate is a practical implementation. If a metal gate is applied, such as molybdenum used for self-aligned TFTs on Corning's SiOG, the presently disclosed FLA process can be accomplished prior to the metal gate and dopant introduction. The dopant activation can be accomplished by, for example, via furnace annealing following the formation of FLAPS. Experiments on FLA crystallization and dopant activation support the feasibility of this approach (see T. Mudgal, supra.). A bottom-gate approach that is also compatible with FLA is the use of a doped polysilicon or a transparent conductive oxide such as ITO. This can be implemented, for example, using a self-aligned strategy that creates a photoresist implant pattern definition using a through-glass exposure where the gate serves as the mask.

Regarding the FLA system, there are several alternatives involving the HTAC chamber parameters and exposure settings. HTAC chamber parameters include temperature, gas ambient, pressure (sub-atmosphere or above atmosphere), and sample distance. FLA exposure options include, for example, multiple overlapping high-power exposures, or a combination of high frequency pulses (e.g., 10 to 100 Hz) at low power to establish a steady-state thermal surface condition followed by high intensity pulses for crystallization.

Regarding process integration, there are several process variants that can be created by simply changing the order of process steps (e.g., FLA, ion implantation, furnace annealing) in the disclosed process flow. Dopant pre-deposition can be a replacement of ion implantation.

Referring to the Figures, FIG. 1 shows a schematic of a disclosed super mesa (100) including: a substrate (105) such as a glass or like support material; and an isolated silicon island (110) on the surface of the support material. The isolated silicon island (110) can include, for example: one or more supersized grains or super grains (115). The super grains (115) can include one or more (such as a plurality of) crystallites (117) of high purity polycrystalline silicon within the boundary or crystallization fronts (119). The super grain (115) can be, for example, an equilateral triangle, a trapezoid, or an isosceles triangle having a base (b) and height (h) dimensions. Within the super grains (115) one or more mesa or transistor active regions (120) can be identified or defined for further processing into a device including the polycrystalline silicon mesa (120) or a portion thereof.

FIG. 2 shows a schematic (200) summary of the disclosed method encompassing starting material substrates that lead to high performance transistors. FIG. 2 schematically shows a process for transforming a-Si into high performance flash-lamp annealed polycrystalline silicon (FLAPS) thin film transistors (TFTs) with channels consisting of aligned, large grain polycrystalline silicon from the FLAPS process: (A) plasma-enhanced chemical vapor deposition (PECVD) of a-Si onto the substrate (105), which is subsequently dehydrogenated (107); (B) a pre-activation etch for edge-directed crystallization (108) and application of an oxide capping layer (109) such as $SiO_2$, deposited via PECVD, and pattern definition and ion implantation of dopants, such as boron, phosphorus, and like dopants for PMOS/NMOS source and drain regions; (C) crystallization via flash lamp annealing using a xenon source (210) that produces flash photons (212) to produce polycrystalline silicon (110); (D) forming a transistor active region (120) definition and alignment of grains; and (E) fabricating (intermediate steps not shown) a thin-film transistor structure (220)(e.g., a single TFT shown) atop the transistor active region (120).

FIG. 3 is a plan view (300) that shows the disclosed method shown in FIG. 2 of forming high quality, aligned-grain, active regions for FLAPS TFTs, including the above mentioned steps (A) through (E) and enumerated components. In FIG. 3 (E) an alternative to the single TFT structure of FIG. 2 (E) shows an inverter structure (220).

FIG. 4 shows an image of an actual and exemplary flash lamp annealed (FLA) and crystallized mesa (110) having exemplary dimensions of, for example, a width of 100 microns and a length of 200 microns.

FIGS. 5A and 5B show a scanning electron microscope (SEM) image (FIG. 5A) and an Euler crystal orientation map (image in grey scale; color rendering not provided) (FIG. 5B) from Electron Backscatter Diffraction (EBSD) measurements. SEM image (FIG. 5A) and EBSD mapping (FIG. 5B) of a FLAPS TFT channel region taken from a deprocessed PMOS device that was verified as operational. The boxed region (510) on the SEM image was used for the EBSD analysis. Each color in the EBSD original (only black and white provided) represents a different crystal orientation. The FLAPS channel shows different morphology compared to FIG. 4 but the EBSD result confirmed that the crystallization remains edge directed. Analysis indicated a preferential surface crystal orientation of "(111)".

Figure 6:
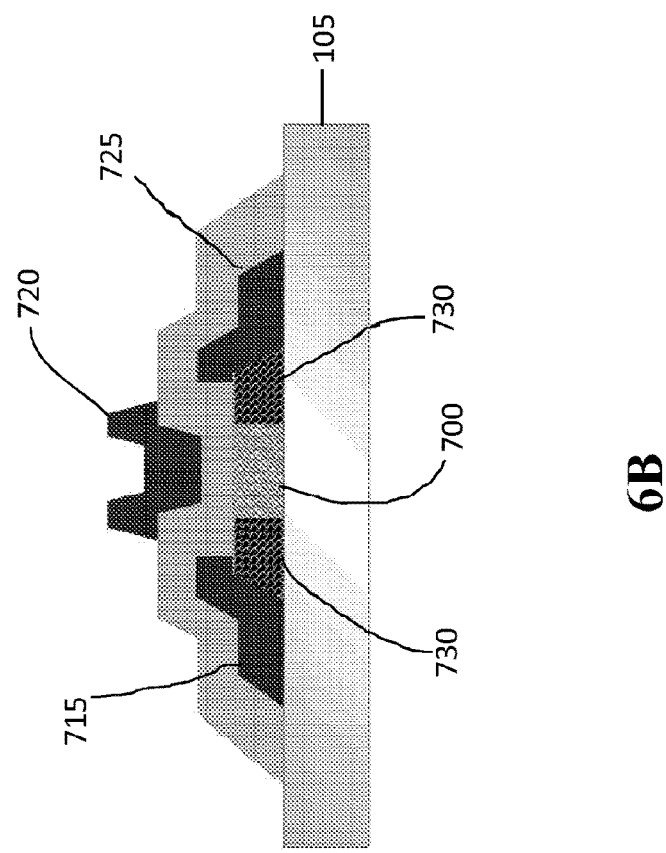
FIGS. 6A and 6B show schematic representations of a disclosed FLAPS TFT in plan view (6A) and a cross section view (6B), respectively.
Figure 6:
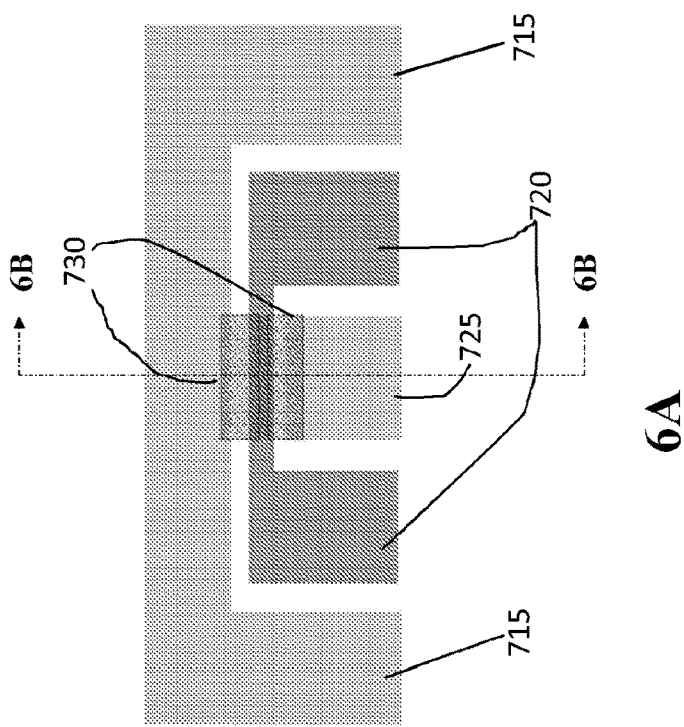

FIGS. 6A and 6B show schematic representations of a disclosed FLAPS TFT in plan view (6A) and a cross section view (6B), respectively, and structure (715), (720), (725), and (730), mentioned in FIGS. 7A and 7B.

FIGS. 7A and 7B show a FLAPS device as a partially processed mesa (FIG. 7A image) showing the mesa structure (750) (the remainder of super-mesa having been etched away) with source/drain and channel regions exhibiting a different apparent texture (i.e., color appearance image not provided). The apparent background region where the super-mesa was etched away (710) has a roughened appearance due to the etch process used. The FIG. 7B image shows a completed TFT structure incorporating the FLAPS device of FIG. 7A (750) (encircled) having an aluminum source contact (715), an aluminum drain contact (725), and an aluminum gate (720) that overlaps the implanted regions (730).

FIGS. 8A and 8B, respectively, show CMOS transfer characteristics using linear (8A)($|V_{DS}|$=0.1V) and log (8B) ($|V_{DS}|$=0.1V and 5 V) scales. The mask-defined channel length (i.e., the distance between source/drain implanted regions) is L=30 microns, and the designed width is W=100 microns. Bias conditions and extracted values of threshold voltage (VT), transconductance (GM), and subthreshold swing (SS) are shown.

Exemplary device characterization results are shown in FIGS. 8A and 8B. The Terada-Muta (T-M) method was used to establish the effective electrical channel length ($L_{eff}$), with plots shown in FIGS. 9 and 10. Note that only $L_{mask}$=32 microns and 20 microns were available for the analysis. The T-M analysis worked reasonably well on both NMOS (FIG. 9) and PMOS (FIG. 10) FLAPS TFT devices. However, lower $|V_{GS}-V_T|$ values were excluded for the PMOS analysis due to minor inconsistencies in extrapolated intercepts presumed to be related to trap states. Magnification of the intersection of each plot in FIGS. 9 and 10 identified the channel length offset (ΔL) that is needed to arrive at the effective electrical channel length (Leff). The channel length offset (ΔL) values were 6.3 microns and 13.4 microns for NMOS and PMOS devices, respectively. The on-state and off-state operational parameters for the exemplary transfer characteristics shown in FIGS. 8A and 8B were extracted once $L_{eff}$ was established, with results listed in Table 1. The width (W) of the TFTs was taken as the designed value of 100 microns. The oxide capacitance was calculated from the 100 nm deposition thickness. The channel mobility values were calculated from the maximum transconductance at $|V_{DS}|$=0.1 V. The extracted channel mobility values were 380 $cm^2/V \cdot s$ and 143 $cm^2/V \cdot s$ for electrons and holes, respectively. Off-state parameters were minimum subthreshold swing (SS) values below 150 mV/dec, and about 1 pA/micron leakage current at $|V_{DS}|=5$ V.

FIGS. 8A and 8B show transfer characteristics for NFETs and PFETs fabricated in polycrystalline silicon. FIG. 8A shows the linear operation mode characteristics on a linear scale at drain-source bias of 0.1 V. The threshold voltage is linearly extrapolated from the NMOS characteristic curve (805) to 0.23 V with a transductance of 5.10 microA/V. Similarly, the threshold voltages are extracted from the PMOS curve (800) and is −2.82 V with a transconductance of 2.66 microA/V. FIG. 8B shows the transfer linear and saturation mode characteristic curves plotted on a logarithmic scale. The linear mode ($|V_{DS}|=0.1$ V) PMOS curve (810) and saturation mode ($|V_{DS}|=5V$) PMOS curve (811) overlap in the subthreshold region (812) and exhibit a subthreshold slope of 140 V/dec. The linear mode NMOS curve (815) and the saturation mode NMOS curve (816) overlap in the subthreshold region (817) and exhibit a subthreshold slope of 118 mV/dec.

FIG. 9 shows a NFET T-M analysis of NMOS TFTs.

FIG. 10 shows a PFET T-M analysis of PMOS TFTs. The reference dimensions for channel length (x-axis) are the mask-defined distance between implanted source/drain regions.

Figure 11:
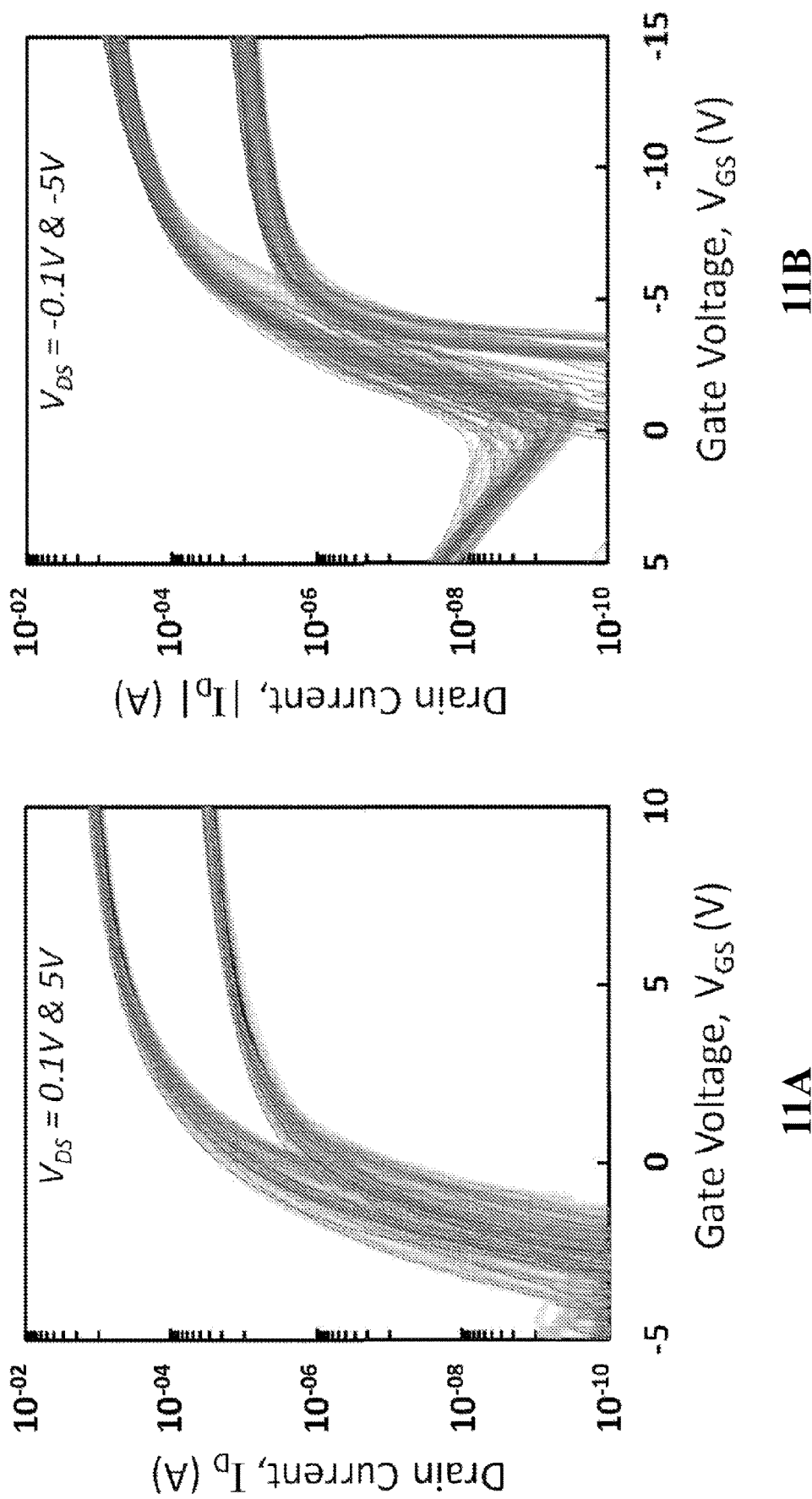
FIGS. 11A and 11B are overlay plots of current-voltage characteristics of NMOS and PMOS devices, respectively.

FIGS. 11A and 11B are overlay plots of current-voltage characteristics of NMOS and PMOS devices, respectively, made with the disclosed FLAPS articles and methods, and the plots demonstrate superior device performance, i.e., consistently low variation. While there is noted variation in device operation, the plots demonstrate the potential of the disclosed FLAPS method for improved device performance and manufacturability.

EXAMPLES

The following Examples demonstrate making, use, and analysis of the disclosed polysilicon and methods in accordance with the above general procedures.

Example 1

Super-Mesa Sample Preparation

The super mesa location was arbitrarily defined or is defined in relation to the edges of the substrate. A photo-sensitive resist (i.e., photoresist) was coated on a substrate with an amorphous silicon film. The photoresist was exposed in selected regions with UV light using a photomask (e.g., chrome pattern on glass). The exposed photoresist was dissolved in developer solution, uncovering regions of amorphous silicon to be removed. The un-exposed photoresist remained and masked the super-mesa regions. The unprotected amorphous silicon was etched in fluorine ion plasma containing fluorine ions. The etching was completed upon exposure of the substrate. The remaining photoresist over the super-mesa regions was removed using, for example, a ketone-based solvent or oxygen ion plasma. The substrate was cleaned in heated solutions of HCl or NH$_4$OH mixed with hydrogen peroxide. A silicon dioxide capping layer was deposited. The super-mesa (108) remained on the substrate as shown in FIG. 3 (B).

Example 2

Super-Mesa FLA Exposure and TFT Mesa

The super mesa structure of Example 1 then underwent FLA exposure using nominal substrate temperature and flash exposure settings. The mesa pattern definition was applied to the FLAPS super mesa, with the photoresist polygons shown in FIG. 3 (C) protecting the incipient mesa regions (120) from removal during a F$^-$ ion plasma etch. Following the plasma etch and photoresist removal, the TFT mesa structures (120) appeared as shown in FIG. 3 (D). NMOS and PMOS TFTs were then fabricated in the FLAPS mesa structures.

Example 3

CMOS Characteristics of FLAPS TFTs

Current-voltage characteristics of NMOS and PMOS devices were measured on disclosed FLAPS devices. The overlay plots of from about 30 to 40 devices in FIGS. 11A and 11B show nominal variation in performance. Selected devices shown in FIGS. 8A and 8B demonstrate superior results using the disclosed process of FLA crystallization of silicon. Previous work which demonstrated FLA LTPS TFTs on crystallized material without preferential grain alignment provided current-voltage characteristics for PMOS devices only, and only under low drain bias conditions (i.e., $V_{DS}=-0.1V$) (see S. Saxena, et al., IEEE Electron Device Letters, supra.)]

Example 4

FLAPS Surface Morphology

A device that had been previously verified as operational and having good performance characteristics was deprocessed (i.e., deconstruction or reversing selected manufacturing steps to elucidate structural antecedents and integrity) to establish the associated FLAPS surface morphology. SEM imaging revealed a channel region as shown in FIG. 5A. EBSD mapping shown in FIG. 5B confirmed that the disclosed crystallization process is edge directed.

The disclosure has been described with reference to various specific embodiments and techniques. However, many variations and modifications are possible while remaining within the scope of the disclosure.

What is claimed is:

1. A method of making polycrystalline silicon comprising:
    depositing amorphous silicon on at least a portion of a suitable substrate having a strain point of from 650° C. to 800° C. to produce an amorphous silicon super-mesa on the substrate;
    dehydrogenating the amorphous silicon super-mesa on the substrate;
    patterning the dehydrated amorphous silicon super-mesa on the substrate to produce a patterned amorphous silicon super-mesa on the substrate;
    depositing a capping oxide layer on the patterned amorphous silicon super-mesa on the substrate to form a capped patterned amorphous silicon super-mesa on the substrate;
    heating the capped patterned amorphous silicon super-mesa on the substrate below an intrinsic solid phase crystallization temperature of amorphous silicon, to form a heated, capped, and patterned amorphous silicon super-mesa on the substrate; and
    flash lamp annealing the heated, capped, and patterned amorphous silicon super-mesa on the substrate with a xenon lamp at a voltage of from 550 to 700 V and a suitable pulse duration while continuing to heat at from 525° C. to 550° C., to produce polycrystalline silicon on the substrate, wherein the polycrystalline silicon has crystal growth that is edge initiated, the polycrystalline silicon comprising supersized grains and one or more mesa regions.

2. The method of claim 1, wherein the suitable pulse duration is from 150 to 300 microseconds.

3. The method of claim 1, further comprising:
removing the supersized grains outside the one or more mesa regions from the substrate.

4. The method of claim 3, wherein removing the supersized grains outside the one or more mesa regions is accomplished by cutting, etching, ablation, or a combination thereof, and a size of the one or more mesa regions is any size suitable for a transistor article.

5. The method of claim 1, further comprising:
forming a transistor from the one or more mesa regions, the transistor having a crystal grain direction parallel to a direction of current flow.

6. The method of claim 1, wherein patterning the dehydrated amorphous silicon super-mesa on the substrate comprises a masking and etching including photolithography combined with aqueous or plasma etching.

7. The method of claim 1, wherein the suitable substrate is selected from at least one of: a glass sheet, a roll-to-roll glass, a sheet-to-sheet glass, a glass-ceramic sheet, or a combination thereof.

8. A conducting device comprising:
polycrystalline silicon comprising at least two silicon crystal grains on a glass substrate, wherein the polycrystalline silicon has crystal growth that is edge initiated; and
the conducting device having an electron mobility of greater than 300 $cm^2$ per volt second at 25° C., a hole mobility of greater than or equal to 100 $cm^2$ per volt second at 25° C., and a sub-threshold swing of less than 150 mV/decade at 25° C., and wherein the conducting device is included in or selected from at least one of: a MOSFET, a diode, a capacitor, and combinations thereof.

9. The conducting device of claim 8, wherein the electron mobility is from 350 to 450 $cm^2$ per volt second at 25° C. and the sub-threshold swing is from 60 to 100 mV/decade at 25° C.

10. A method of making a device comprising:
incorporating at least one of the conducting device of claim 8 into another device or platform.

11. A device comprising:
at least one of the conducting device of claim 8.

* * * * *

UNITED STATES PATENT AND TRADEMARK OFFICE
CERTIFICATE OF CORRECTION

PATENT NO. : 11,158,504 B2  
APPLICATION NO. : 16/635056  
DATED : October 26, 2021  
INVENTOR(S) : Karl D Hirschman et al.

It is certified that error appears in the above-identified patent and that said Letters Patent is hereby corrected as shown below:

On the Title Page

On page 2, in Column 1, item (56), Other Publications, Line 3, delete "(2016." and insert -- (2016). --, therefor.

On page 2, in Column 2, item (56), Other Publications, Line 1, delete "Electronis" and insert -- Electronics --, therefor.

On page 2, in Column 2, item (56), Other Publications, Line 3, delete "(2008." and insert -- (2008). --, therefor.

On page 2, in Column 2, item (56), Other Publications, Line 5, delete "Amorpohous" and insert -- Amorphous --, therefor.

On page 2, in Column 2, item (56), Other Publications, Line 6, delete "(2017." and insert -- (2017). --, therefor.

On page 2, in Column 2, item (56), Other Publications, Line 12, delete "(2009." and insert -- (2009). --, therefor.

On page 2, in Column 2, item (56), Other Publications, Line 18, delete "(2013." and insert -- (2013). --, therefor.

On page 2, in Column 2, item (56), Other Publications, Line 22, delete "Devie" and insert -- Device --, therefor.

In the Specification

In Column 1, Lines 15-19 (approx.), below "herein by reference in their entirety." delete "This application claims the benefit of priority under 35 U.S.C. .sctn. 119 of U.S.

Signed and Sealed this  
Twenty-eighth Day of December, 2021

Drew Hirshfeld  
*Performing the Functions and Duties of the*  
*Under Secretary of Commerce for Intellectual Property and*  
*Director of the United States Patent and Trademark Office*

Provisional Application Ser. No. 62/539,042, filed on Jul. 31, 2017, the content of which is relied upon and incorporated herein by reference in its entirety.".